United States Patent [19]
Mori

[11] Patent Number: 4,922,365
[45] Date of Patent: May 1, 1990

[54] OVERVOLTAGE SUPPRESSING CIRCUIT FOR SEMICONDUCTOR DEVICE

[75] Inventor: Haruyoshi Mori, Kobe, Japan

[73] Assignee: Mitsubishi Denki Kabushiki Kaisha, Tokyo, Japan

[21] Appl. No.: 337,420

[22] Filed: Apr. 13, 1989

[30] Foreign Application Priority Data

Apr. 15, 1988 [JP] Japan ................... 63-93872

[51] Int. Cl.$^5$ .............................................. H02H 7/10
[52] U.S. Cl. ........................... 361/18; 361/56; 361/58; 361/91; 361/111; 323/276; 363/56
[58] Field of Search ............... 361/18, 56, 58, 91, 361/111, 42, 79, 86, 89; 323/276, 275, 281, 279, 285, 284, 313, 351, 315, 317; 363/55.56

[56] References Cited

U.S. PATENT DOCUMENTS

| | | | |
|---|---|---|---|
| 3,736,495 | 5/1973 | Calkin et al. | 361/18 |
| 3,835,368 | 9/1974 | Williams | 323/351 |
| 4,329,729 | 5/1982 | Knight | 361/91 |

OTHER PUBLICATIONS

Nair, et al., "Voltage Clamp Circuits For A Power Mosfet PWM Inverter"; pp. 911–920; *IEEE Transactions of Industry Applications*, vol. 1A-23, No. 5 Sep.-/Oct. 1987.

*Primary Examiner*—Todd E. Deboer
*Attorney, Agent, or Firm*—Bernard, Rothwell & Brown

[57] ABSTRACT

Disclosed is an overvoltage suppressing circuit for a semiconductor device connected between the poles of a DC power source and adapted to effect a switching operation. The circuit comprises: a serial circuit connected in parallel with a semiconductor device and including an overvoltage suppressing capacitor, an oscillation suppressing diode, and an impedance regulator connected in series each other, the impedance regulator being operable to change into a state of high impedance for suppressing a reverse current flowing into the oscillation suppressing diode when the oscillation suppressing diode is turned off; and a discharging device connected between a DC power source and the overvoltage suppressing capacitor for discharging to the DC power source a charge accumulated in the overvoltage suppressing capacitor when the oscillation suppressing diode is off.

13 Claims, 6 Drawing Sheets

OVERVOLTAGE SUPPRESSING CIRCUIT FOR SEMICONDUCTOR DEVICE

BACKGROUND OF THE INVENTION

1. Field of the Invention

The present invention relates to an overvoltage suppressing circuit for a semiconductor device which is adapted to suppress an overvoltage of a semiconductor switching device used for a power converter or the like.

2. Description of the Related Art

FIG. 7 is a circuit diagram of a chopper circuit having an overvoltage suppressing circuit of a semiconductor device disclosed in "Voltage Clamp Circuit for a Power MOSFET PWM Inverter" IEEE TRANSACTIONS ON INDUSTRY APPLICATIONS Vol. IA-23 No. 5 SEPTEMBER/OCTOBER 1987, pp. 911-920. In the drawing, the chopper circuit comprises a DC power source 1; a transistor 2; a parasitic capacitance 3 between the main circuit terminals of the transistor 2; a reflux diode 4 inserted between the emitter of the transistor 2 and the negative pole of the DC power source 1; a load device 5 connected in parallel with the reflux diode 4; and an overvoltage suppressing circuit 6 for the transistor 2 including an overvoltage suppressing capacitor 61, an oscillation suppressing diode 62, and a discharging resistor 63 for the overvoltage suppressing capacitor 61.

The overvoltage suppressing capacitor 61 and the oscillation suppressing diode 62 are connected in series between the collector and emitter of the transistor 2, while the discharging resistor 63 is connected between the negative pole of the DC power source 1 and a connecting point between the overvoltage suppressing capacitor 61 and the oscillation suppressing diode 62.

In the drawing, reference numeral 7 denotes an inductance of the wiring.

A description will now be given of the operation with reference to a waveform diagram shown in FIG. 8. The transistor 2 being energized is turned off at time $T_0$.

A voltage $V_{CE}$ between the main circuit terminals of the transistor 2 rises from time $T_0$ and reaches a terminal voltage $V_D$ of the DC power source at time $T_1$. After time $T_1$, the current $i_c$ of the transistor 2 decreases gradually from a collector DC current Ic. The inductance 7 of the wiring tries to maintain a current $i_D$ flowing from the DC current source 1 at a constant level. Since the current $i_D$ of the DC power source 1 is branched at a Connection point $P_1$ into the current $i_C$ flowing to the transistor 2 and a current $i_S$ flowing to the overvoltage suppressing circuit 6, the following relationship exists among the currents $i_D$, $i_C$ and $i_S$:

$$i_S = i_D - i_C \quad (1)$$

Accordingly, if the current $i_D$ is assumed to be fixed during the period from the time $T_1$ to the time $T_2$, as shown in FIG. 8, the current $i_S$ flowing into the overvoltage suppressing circuit 6 increases in accordance with Formula (1) with a decrease in the current flowing through the transistor 2.

The period from time $T_2$ to time $T_3$ is a period in which energy accumulated in the inductance 7 of the wiring is absorbed by the capacitor 61. In addition, when the current $i_S$ is reduced to 0 at time $T_3$, a current flows through the diode 62 in the opposite direction since the diode 62 does not have ideal characteristics, so that the current flowing through the diode 62 is suddenly cut off at time $T_4$ when the internal carriers disappear.

For this reason, the current which has been flowing through the diode 62 commutes to the parasitic capacitance 3 of the transistor 2.

After time $T_4$, since the diode 62 is off, the voltage $V_{CE}$ of the transistor 2 undergoes damped oscillation, from a maximum voltage $V_P$ of the overvoltage suppressing capacitor 61, due to the parasitic capacitance 3, the inductance 7 of the wiring, and the component of resistance contained in the wiring. In addition, the energy charged in the overvoltage suppressing capacitor 61 from the inductance 7 of the wiring during the period from time $T_2$ to $T_3$ is discharged through the discharging resistor 63. Accordingly, a current $i_R$ flowing through the discharging resistor 63 declines after time $T_4$, as shown in FIG. 8.

Since the conventional overvoltage suppressing circuit for a semiconductor device is arranged as described above, there has been a problem that, due to the phenomenon in which the current passing through the transistor 2 changes suddenly to cause voltage oscillation in the transistor 2 when the diode 62 is turned off so that the electromagnetic noise generated by the apparatus becomes large.

SUMMARY OF THE INVENTION

Accordingly, it is an object of the present invention to provide an overvoltage suppressing circuit of a semiconductor device which is capable of suppressing the overvoltage of a semiconductor switching device and which is capable of reducing the electromagnetic noise to a low level.

To this end, an overvoltage suppressing circuit for a semiconductor device in accordance with the present invention comprises a serial circuit connected in parallel with a semiconductor device and including an overvoltage suppressing capacitor, an oscillation suppressing diode, and impedance regulating means connected in series each other, the oscillation suppressing diode being turned off due to the switching operation of the semiconductor device, the impedance regulating means being operable to change into a state of high impedance for suppressing a reverse current flowing into the oscillation suppressing diode when the oscillation suppressing diode is turned off; and discharging means connected between a DC power source and the overvoltage suppressing capacitor for discharging to a DC power source a charge accumulated in the overvoltage suppressing capacitor when the oscillation suppressing diode is off.

DESCRIPTION OF THE PREFERRED EMBODIMENTS

Referring now to the accompanying drawings, a description will be given of the embodiments of the present invention.

Figure 1:
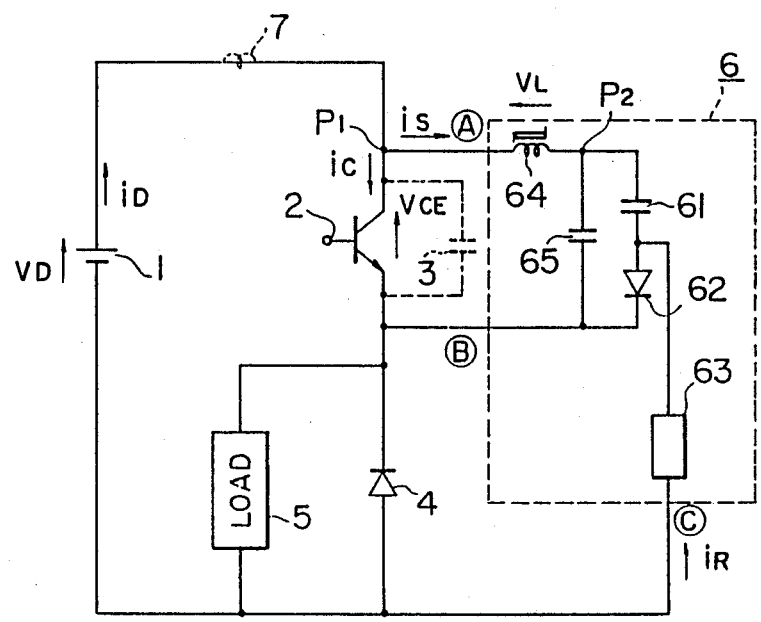
FIG. 1 is a circuit diagram of a chopper circuit having an overvoltage suppressing circuit for a semiconductor device in accordance with a first embodiment of the present invention.

In FIG. 1, the collector of a transistor 2 used as a semiconductor switching device is connected to the positive pole of a DC power source 1, while a reflux diode 4 is connected between the emitter of the transistor 2 and the negative pole of the DC power source 1. A load device 5 is connected in parallel with this reflux diode 4. The transistor 2 has a parasitic capacitance 3 between main circuit terminals A and B thereof, i.e., between the collector and the emitter, and a serial circuit comprising a saturable reactor 64 and a first capacitor 65 for saturating the saturable reactor 64 is connected between the collector and the emitter of the transistor 2. In addition, a serial circuit comprising a second capacitor 61 for overvoltage suppressing and an oscillation suppressing diode 62 is connected to the first capacitor 65 in parallel therewith. A point of connection between the second capacitor 61 and the oscillation suppressing diode 62 is connected to the negative pole of the DC power source 1 via a discharging resistor 63. An overvoltage suppressing circuit 6 for the transistor 2 is formed by the second capacitor 61, the oscillation suppressing diode 62, the discharging resistor 63, the saturable reactor 64, and the first capacitor 65. In addition, the wiring connecting the DC power source 1, the transistor 2, and the load device 5 has an inductance 7. It should be noted that the saturable reactor 64 should be selected which has characteristics of moving smoothly from a non-saturated area to a saturated area and that $V_L$ denotes a terminal voltage of the saturable reactor 64 in FIG. 1.

Figure 2:
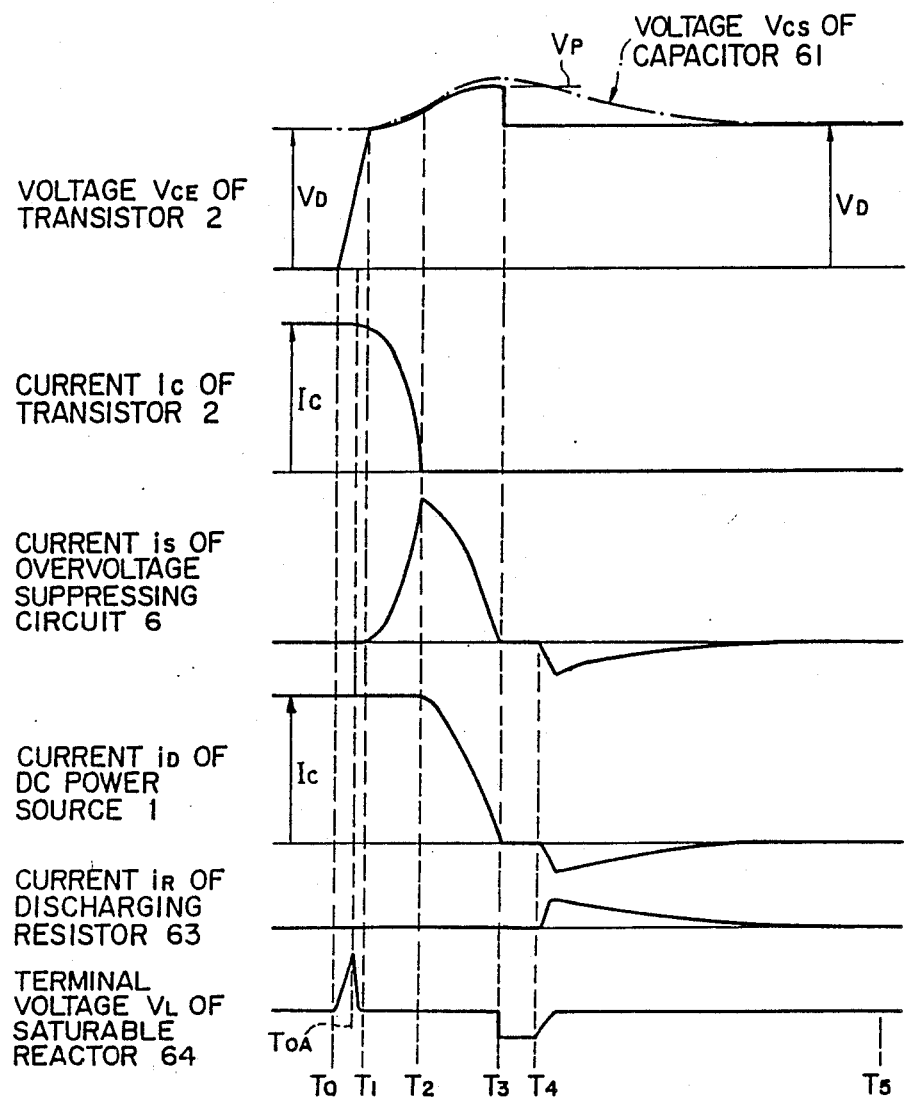
FIG. 2 is a timing chart illustrating the operation of the first embodiment.
Figure 3:
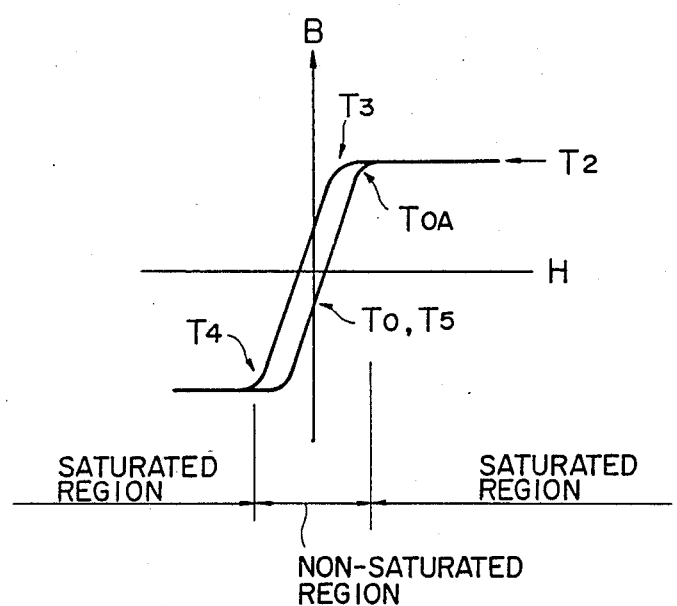
FIG. 3 is a B-H characteristic diagram of a saturable reactor used in the first embodiment.

A description will now be given of the operation with reference to FIGS. 2 and 3. FIG. 2 illustrates the waveforms of a voltage or current in various parts when the transistor 2 is turned off. FIG. 3 illustrates the B-H characteristics of the saturable reactor 64 and points of operation at the respective times shown in FIG. 2.

The transistor 2 remains on until the time $T_0$ shown in FIG. 2, and is turned off after the time $T_0$. Due to this turning off operation, a voltage $V_{CE}$ between the main circuit terminals A and B of the transistor 2 rises after the time $T_0$.

At the time $T_0$, the voltage of the first capacitor 65 is 0 V, while the saturable reactor 64 is unsaturated at this time $T_0$, if it is assumed that an exciting current is very small at the time of non-saturation as shown in FIG. 3.

After the time $T_0$, the same voltage as the voltage $V_{CE}$ between the main circuit terminals of the transistor 2 is applied to the saturable reactor 64. The saturable reactor 64 becomes saturated at time $T_{04}$ by a time integral of this voltage.

After the saturable reactor 64 has become saturated at the time $T_{04}$, electrically speaking, the situation is the same as that in which no saturable reactor 64 is provided. The voltage $V_{CE}$ between the main circuit terminals of the transistor 2 reaches the terminal voltage $V_D$ of the DC power source 1 at the time $T_1$ while the capacitor 65 is being charged, as shown in FIG. 2.

Although, after the time $T_1$, the current $i_C$ of the transistor 2 decreases from a collector DC current $I_C$ of the transistor 2, since the inductance 7 of the wiring attempts to maintain the current $i_D$, which has been flowing from the DC power source 1, at a constant level, the reduced amount of the current $i_C$ flowing through the transistor 2 flows to the overvoltage suppressing circuit 6.

In addition, from the time $T_2$ when the current $i_C$ flowing through the transistor 2 becomes zero, the energy accumulated in the inductance 7 of the wiring is absorbed by the first and second capacitors 65 and 61 of the overvoltage suppressing circuit 6.

At the time $T_3$ when the current $i_D$ from the DC power source 1 and the current $i_S$ of the overvoltage suppressing circuit 6 are reduced to zero, the saturable reactor 64 enters an unsaturated region, as shown in FIG. 3, and the impedance thereof becomes high. Accordingly, no large current in the reverse direction flows to the oscillation suppressing diode 62, and an excessive amount of carriers accumulated in the P-N junction disappear.

As a result, since the oscillation suppressing diode 62 is off when the saturable reactor 64 enters a saturated region at the time $T_4$, most of the energy of the inductance 7 of the wiring accumulated in the second capacitor 61 passes through the discharging resistor 63 and the saturable reactor 64 as the discharging current $i_R$, as shown in FIG. 2, and is discharged into the DC power source 1 without undergoing oscillation.

Meanwhile, at the time $T_4$, a remaining amount of the energy of the inductance 7 of the wiring accumulated in the first capacitor 65 passes through the saturable reactor 64 and the load device 5 or the reflux diode 4 and is discharged into the DC power source 1 without undergoing oscillation.

At the time $T_5$ when the discharging of the first and second capacitors 65 and 61 is completed, the saturable reactor 64 has the same point of operation as that at the time $T_0$, as shown in FIGS. 2 and 3.

Thus, in accordance with this embodiment, when the oscillation suppressing diode 62 in the overvoltage suppressing circuit 6 is turned off, a reverse current is suppressed by the saturable reactor 64, and this saturable reactor 64 is saturated via the first capacitor 65 when the voltage $V_{CE}$ between the main circuit terminals A and B of the transistor 2 rises. Accordingly, an Overvoltage and voltage oscillation occurring at the time of the switching of the transistor 2 can be suppressed. In addition, the level of magnetic noise generated can be reduced.

Figure 4:
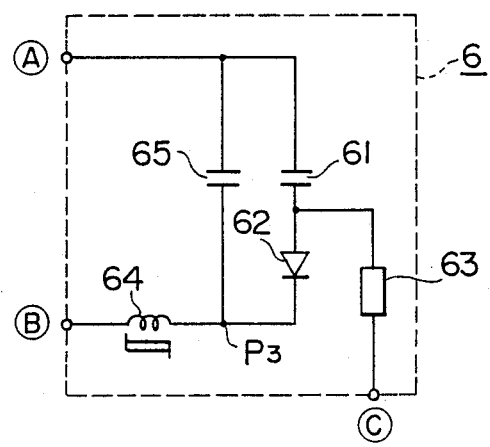
FIG. 4 is a circuit diagram illustrating an overvoltage suppressing circuit in accordance with a second embodiment.

Although, in the above-described embodiment, the saturable reactor 64 is inserted between the main circuit terminal A of the transistor 2 and a point $P_2$ of connection between the first and second capacitors 65 and 61, it is possible to obtain a similar effect if the saturable reactor 64 is inserted between the main circuit terminal B of the transistor 2 and a point $P_3$ of connection between the first capacitor 65 and the oscillation suppressing diode 62 as shown in FIG. 4.

Figure 5:
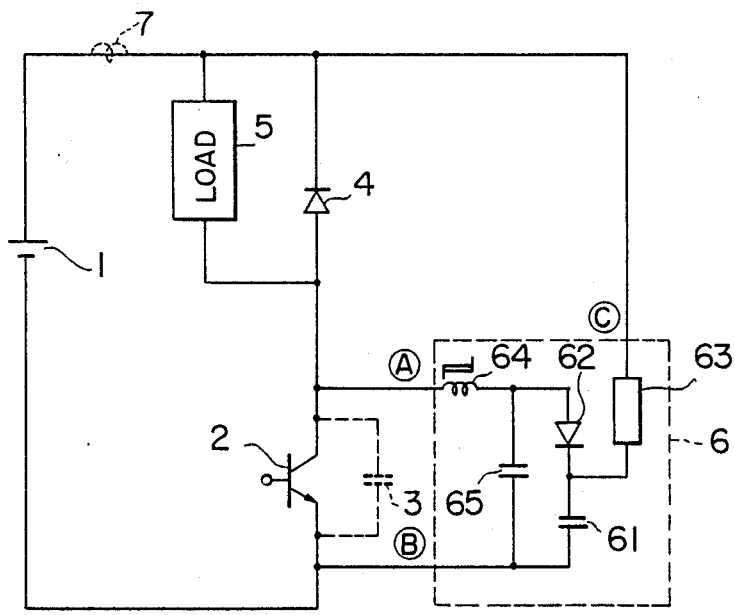
FIG. 5 is a circuit diagram illustrating a chopper circuit having an overvoltage suppressing circuit in accordance with a third embodiment.
Figure 6:
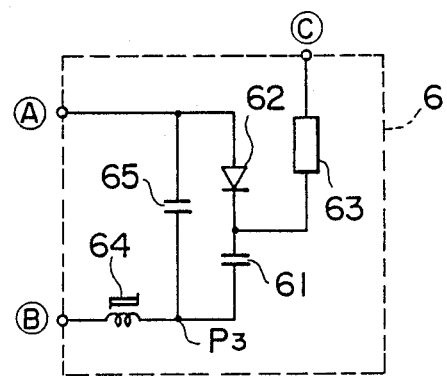
FIG. 6 is a circuit diagram illustrating an overvoltage suppressing circuit in accordance with a fourth embodiment.
Figure 7:
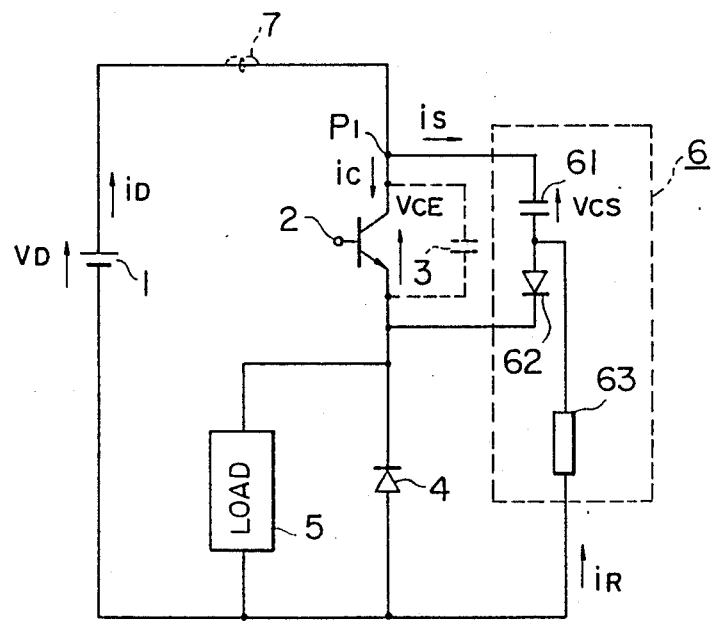
FIG. 7 is a circuit diagram illustrating a chopper circuit having a conventional overvoltage suppressing circuit.
Figure 8:
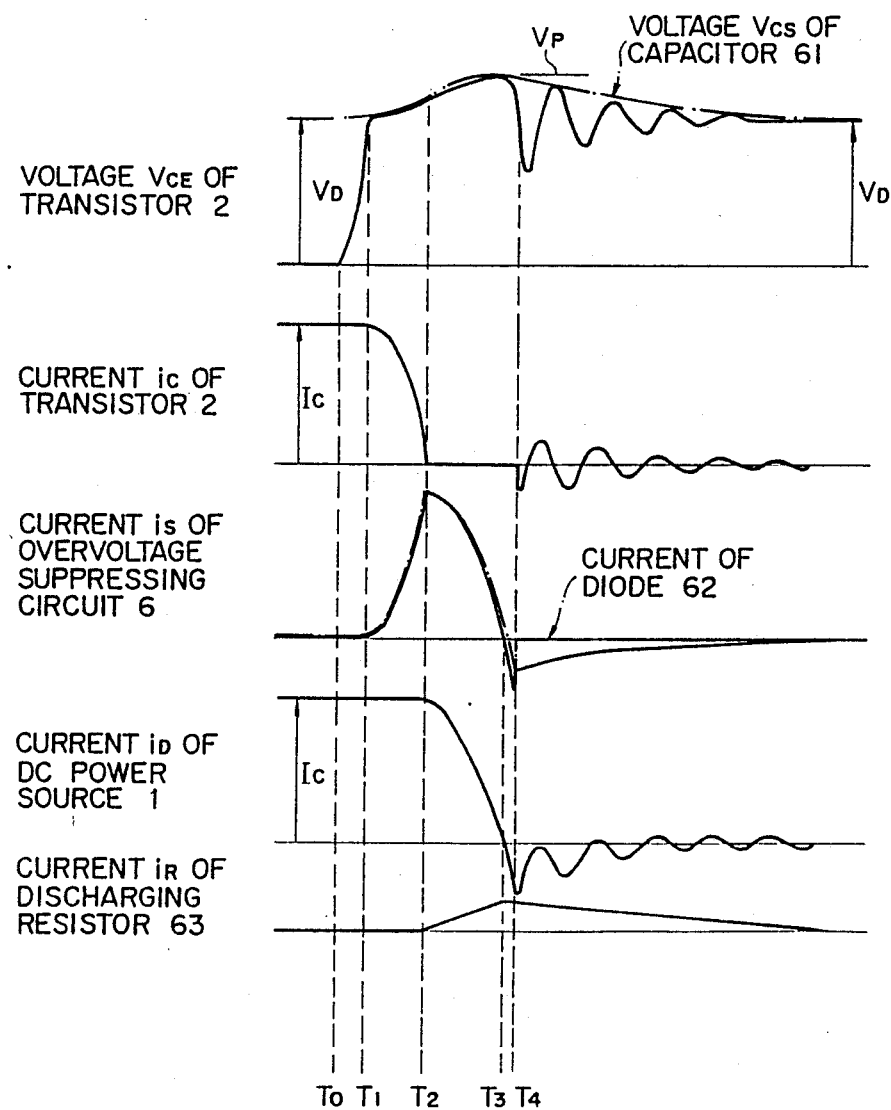
FIG. 8 is a timing chart illustrating the operation of the circuit shown in FIG. 7.

Furthermore, although the case has been described in which one end of the semiconductor switching device, i.e., the collector of the transistor 2, is connected to the positive pole of the DC power source 1, the present invention can also be applied to a case in which one end of the transistor 2 is connected to the negative pole of the DC power source 1, as shown in FIG. 5, and it is possible to obtain an advantage similar to that of the abovedescribed embodiment. In addition, in this case as well, the saturable reactor 64 may be connected to one end B of the transistor 2 and the point $P_3$ of connection between the first and second capacitors 65 and 61, as shown in FIG. 6.

Moreover, although in the foregoing embodiments an example has described of the case in which the present invention is applied to a chopper circuit, an advantage similar to those of the foregoing embodiments can be obtained when applied to an inverter circuit or the like.

In addition, although in the foregoing embodiments, an example has been illustrated of the case in which the transistor 2 is used as a semiconductor switching device, a similar advantage can be obtained when a MOSFET, a BiMOS device, an IGBT (insulated-gate bipolar transistor) or a similar semiconductor switching device is used.

What is claimed is:

1. A circuit for suppressing an overvoltage of a semiconductor device connected between the poles of a DC power source and adapted to effect a switching operation, said circuit comprising:
   a serial circuit connected in parallel with a semiconductor device and including an overvoltage suppressing capacitor, an oscillation suppressing diode, and an impedance regulating means connected in series with each other, said oscillation suppressing diode being turned off due to the switching operation of said semiconductor device, said impedance regulating means being operable to change into a state of high impedance for suppressing a reverse current flowing into said oscillation suppressing diode when said oscillation suppressing diode is turned off; and
   discharging means connected between a DC power source and said overvoltage suppressing capacitor for discharging to said DC power source a charge accumulated in said overvoltage suppressing capacitor when said oscillation suppressing diode is off.

2. A circuit according to claim 1, wherein said impedance regulating means includes a saturable reactor.

3. A circuit according to claim 2, wherein said saturable reactor has a low impedance when saturated and has a high impedance when non-saturated.

4. A circuit according to claim 3, further comprising a saturating capacitor connected in parallel with said overvoltage suppressing capacitor and said oscillation suppressing diode and connected in series to said saturable reactor.

5. A circuit according to claim 4, wherein said saturable reactor is saturated via said saturating capacitor by means of a rising voltage occurring between the poles of said semiconductor device when said semiconductor device is turned off.

6. A circuit according to claim 5, wherein said saturable reactor becomes non-saturated when a current flowing from said DC power source becomes zero after said semiconductor device is turned off.

7. A circuit according to claim 1, wherein said discharging means is a resistor connected between said DC power source and a point of connection between said overvoltage suppressing capacitor and said oscillation suppressing diode.

8. A circuit according to claim 1, further comprising a reflux diode connected in series between said semiconductor device and said DC power source.

9. A circuit according to claim 1, further comprising a load device connected in series between said semiconductor device and said DC power source.

10. A circuit according to claim 1, wherein said semiconductor device is a transistor.

11. A circuit according to claim 1, wherein said semiconductor device is a MOSFET.

12. A circuit according to claim 1, wherein said semiconductor device is a BiMOS device.

13. A circuit according to claim 1, wherein said semiconductor device is an IGBT.

* * * * *